(12) United States Patent
Brunolli

(10) Patent No.: US 6,731,135 B2
(45) Date of Patent: May 4, 2004

(54) LOW VOLTAGE DIFFERENTIAL SIGNALING CIRCUIT WITH MID-POINT BIAS

(75) Inventor: Michael J. Brunolli, Escondido, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 09/991,107

(22) Filed: Nov. 16, 2001

(65) Prior Publication Data

US 2002/0190754 A1 Dec. 19, 2002

Related U.S. Application Data

(60) Provisional application No. 60/298,426, filed on Jun. 14, 2001.

(51) Int. Cl.[7] ............... H03K 19/0175; H03K 19/003
(52) U.S. Cl. ........................ 326/83; 326/30; 327/108
(58) Field of Search .................. 326/82–83, 86–87, 326/30–34; 327/108; 330/253

(56) References Cited

U.S. PATENT DOCUMENTS

| | | | |
|---|---|---|---|
| 5,216,297 A | | 6/1993 | Proebsting .................. 326/73 |
| 5,668,468 A | * | 9/1997 | Cargill ........................ 323/316 |
| 5,726,592 A | | 3/1998 | Schulte et al. ................ 327/65 |
| 5,898,297 A | | 4/1999 | Bosnyak et al. ............. 323/315 |
| 5,926,031 A | | 7/1999 | Wallace et al. ............... 326/30 |
| 5,939,904 A | * | 8/1999 | Fetterman et al. ............ 327/67 |
| 5,949,253 A | | 9/1999 | Bridgewater, Jr. ........... 326/86 |
| 6,025,742 A | | 2/2000 | Chan ......................... 327/108 |
| 6,028,467 A | | 2/2000 | Burrows et al. ............ 327/331 |
| 6,037,798 A | | 3/2000 | Hedberg ..................... 326/30 |
| 6,194,949 B1 | | 2/2001 | Hogeboom ................. 327/391 |
| 6,198,307 B1 | | 3/2001 | Garlepp et al. .............. 326/83 |
| 6,313,662 B1 | * | 11/2001 | Ide ............................. 326/83 |
| 6,329,843 B1 | * | 12/2001 | Hirata et al. ................ 326/82 |
| 6,356,141 B1 | * | 3/2002 | Yamauchi .................. 327/543 |
| 6,373,275 B1 | | 4/2002 | Otsuka et al. ............... 326/30 |

FOREIGN PATENT DOCUMENTS

JP 1-273416 1/1998

OTHER PUBLICATIONS

National Semiconductor "Product Folder, DS90LV048A", Jun. 1999.
National Semiconductor "LVDS Products, LVDS Product Family Introductions", Jun. 1999.
National Semiconductor "Product Folder, DS90LV031A", Jun. 1999.

* cited by examiner

*Primary Examiner*—James H Cho
(74) *Attorney, Agent, or Firm*—Pillsbury Winthrop LLP

(57) ABSTRACT

A low voltage differential signaling circuit employs a mid-point biasing scheme that maintains a desired common mode voltage across all logic states signaled by the circuit. In one driver implementation, separate conduction paths are used to signal respective logic states on a pair of differential signal lines. A common pair of resistors are provided in the conduction path between the two signal lines. The midpoint between the pair of resistors is tied to the desired common mode voltage. A midpoint bias circuit is coupled to a variable resistance in the conduction path so as to maintain the desired common mode voltage by virtue of a voltage division so as to minimize the amount of non-conduction path current at the mid point node. In one example, a replica circuit further provides an anticipated midpoint voltage to the midpoint bias circuit for comparison to the desired midpoint voltage. The midpoint bias circuit adjusts the variable resistance in accordance with the comparison.

11 Claims, 4 Drawing Sheets

LOW VOLTAGE DIFFERENTIAL SIGNALING CIRCUIT WITH MID-POINT BIAS

CROSS-REFERENCE TO RELATED APPLICATIONS

The present application is based on, and claims priority from, U.S. Provisional Application No. 60/298,426, filed Jun. 14, 2001, commonly owned by the present assignee, the contents of which are incorporated herein by reference.

FIELD OF THE INVENTION

The present invention relates generally to data signaling devices, and more particularly, to low voltage differential signaling devices having improved impedance and performance characteristics by virtue of a novel mid-point biasing scheme.

BACKGROUND OF THE INVENTION

U.S. application Ser. No. 09/626,264, filed Jul. 25, 2000 and entitled "Low Voltage Differential I/O Device and Method," commonly owned by the present assignee, the contents of which are incorporated herein by reference, dramatically advanced the state of the art of signaling devices, and more particularly, low voltage differential signaling (LVDS) device technology. An example of an LVDS device according to the principles of the above-mentioned application is illustrated in FIG. 1. As shown in FIG. 1, when a differential signal having a first logic state, for example a "positive state", is desired to be transmitted, input D+ is set to a positive voltage (e.g. Vdd or 2.5V) and input D− is set to a zero voltage (e.g. Vss or 0V). This causes PFET Q1 and NFET Q4 to turn on and PFET Q2 and NFET Q3 to turn off, thus causing resistor Rd2 to be oriented in a conduction path between nodes A and B through transistors Q1 and Q4 such that a positive differential voltage of about 330 mV from common mode is established between true and complement signal lines 102 and 104 due to the positive voltage drop across resistor Rd2.

When a differential signal having a second logic state, for example a "negative state", is desired to be transmitted, input D+ is set to a zero voltage (e.g. Vss or 0V) and input D− is set to a positive voltage (e.g. Vdd or 2.5V). This causes PFET Q2 and NFET Q3 to turn on and PFET Q1 and NFET Q4 to turn off, thus causing resistor Rd2 to be oriented in a conduction path between nodes A and B through transistors Q2 and Q3 such that a negative differential voltage of about 330 mV from common mode is established between the true and complement signal lines 102 and 104 due to the negative voltage drop across resistor Rd2.

An advantage of the invention of the above-mentioned application is that the driver impedances Z1 and Z2 of driver 100 will be the same for all logic states as well as for common mode due to the operation of transistors Q1, Q2, Q3 and Q4 and the constant impedances provided by Rd1, Rd2 and Rd3. Moreover, the desired common mode voltage is easily established in both logic states by operation of the driver itself when either transistors Q1 and Q4 are turned on and Q2 and Q3 are turned off or transistors Q2 and Q3 are turned on and Q1 and Q4 are turned off. Accordingly, it should be apparent that the common mode voltage Vcm will be determined by the difference between the voltage at nodes A and B regardless of which pairs of transistors Q1/Q4 and Q2/Q3 are turned on and which are turned off.

Another advantage of the invention of the above-mentioned application is that driver output impedance problems are substantially reduced. In particular, for long transmission lines, because the output impedance is ideally matched with the transmission lines, noise reflections are reduced. For short transmission lines, energy arising from stimulation of parasitic inductors is absorbed by the back termination Rd2 and the parasitic capacitance, thus providing sufficient dampening against ringing on the transmission lines.

Yet another advantage of the invention of the above-mentioned application is that the resistor Rd2 of this configuration can be used as a termination resistor when the transmission lines are being used for bidirectional signaling. For bidirectional signaling mode, transistors Q1, Q2, Q3 and Q4 are driven so as to be turned off, which leaves a parallel resistance of $R_{term}$ and Rd2 between the true and complement signal lines 102 and 104, and allows the voltage between the lines to float to around to the common mode voltage as established by the generator. Accordingly, Rd2 in this mode acts as a receiver termination resistor $R_{term}$.

However, as fabrication technologies have advanced, and as processes continue to reduce feature sizes below 0.25 um, other problems have arisen that are not entirely solved by the above-mentioned application.

For example, although the single-ended output impedance $Z_O$ will be about the same in both output logic states, it can still range about as high as 150 ohms in some applications. This output impedance is difficult to reduce without increasing power substantially (e.g. by 50%), or reducing the output swing below the specified level. However, it would be desirable to lower the output impedance to about 50 ohms to ideally match the load both for differential and single ended reflections.

Further, when porting the same circuit design to different fabrication processes, process tracking may be needed to adjust and re-design the values of different circuit components. This is because the common-mode voltage is derived from a voltage division between components whose resistances may vary from process to process. Meanwhile, the common-mode voltage should desirably be around 1.2 V for all circuits, independent of fabrication process, so as to provide the maximum ground level sensitivity. Accordingly, it would be desirable to have a single circuit design that can provide the desired common-voltage for many different fabrication processes.

SUMMARY OF THE INVENTION

The present invention relates to low voltage differential signaling circuits and schemes. According to one aspect of the invention, a mid-point biasing scheme is employed that maintains a desired common mode voltage across all logic states signaled by the circuit. In one driver implementation, separate conduction paths are used to signal respective logic states on a pair of differential signal lines. A common pair of resistors are provided in the conduction path between the two signal lines. The midpoint between the pair of resistors is tied to the desired common mode voltage. A midpoint bias circuit is coupled to a variable resistance in the conduction path so as to maintain the desired common mode voltage by virtue of a voltage division so as to minimize the amount of non-conduction path current at the mid point node. In one example, a replica circuit further provides an anticipated midpoint voltage to the midpoint bias circuit for comparison to the desired midpoint voltage. The midpoint bias circuit adjusts the variable resistance in accordance with the comparison. In addition to providing stable common mode voltage across all signaling states, the circuit configuration further provides desired output impedance characteristics. Moreover, by virtue of its design, the circuit can be ported to various fabrication processes without process tracking as required by prior designs.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

Figure 2:
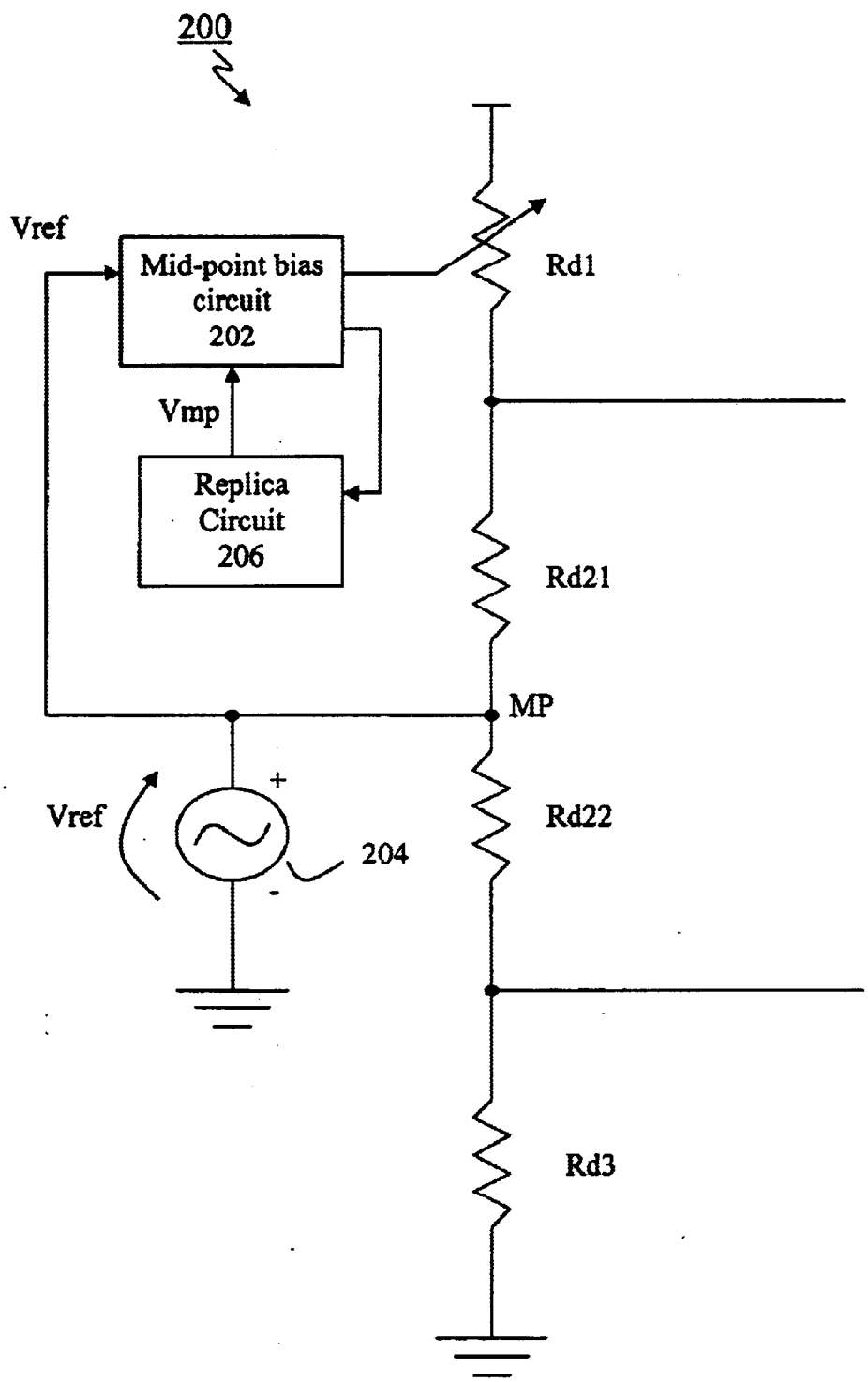
FIG. 2 is a top-level diagram illustrating a voltage-division model of an example LVDS driver circuit in accordance with an aspect of the invention.

A top-level block diagram of an example implementation of the present invention is illustrated in FIG. 2. Although the concepts of the invention will be described in more detail hereinbelow with reference to an exemplary implementation in LVDS applications, those skilled in the art will be able to practice the invention in other types of signaling device applications, including other types of differential signaling applications, after being taught by the examples provided below. Such examples will be understood to be illustrative rather than limiting the invention to applications adhering to the LVDS standard. Moreover, although the invention will be described below with reference to an example configuration of a driver circuit, the invention applies to other signaling configurations such as receiver circuits.

As shown in FIG. 2, with the LVDS driver circuit 200 modeled as a voltage divider as in U.S. application Ser. No. 09/626,264, the present invention splits Rd2 into two equal resistors Rd21 and Rd22, and ties the midpoint (MP) of these two resistors to a voltage source 204 supplying a voltage reference Vref, which voltage reference is preferably equal to the desired common mode voltage Vcm (in LVDS applications) of about 1.2V. This allows the common mode voltage to be fixed for different fabrication processes of the circuit. Further, the resistors Rd21 and Rd22 can be easily designed to establish a desired single mode output impedance of about 50 ohms.

In the above circuit, it is desired that DC current between the node MP at the midpoint of resistors Rd21 and Rd22 and voltage source 204 be minimized so as to reduce power consumption, as well as to minimize voltage drops on the Vref bus for example. Accordingly, the present invention further provides a mid-point bias circuit 202 whose output is used to adjust the effective resistance of Rd1, thus keeping the voltage at the mid-point node MP at the desired common mode voltage without drawing current from the attached voltage source 204 by operation of the voltage division between Rd1, Rd21, Rd22 and Rd3. The above circuit further includes a replica circuit 206 that provides a voltage Vmp having a magnitude that represents what the voltage value at node MP would be were it not for operation of the voltage source 204.

Generally, mid-point bias circuit 202 continually senses the difference between the constant reference voltage Vref and the replica midpoint voltage Vmp. Depending on the anticipated variations in the MP node voltage from the desired reference voltage Vref, mid-point bias circuit 202 causes the resistance Rd1 to change in compensation therefor, thus maintaining the voltage at node MP at the desired value by operation of the voltage division between the variable resistance Rd1, and the constant resistances Rd21, Rd22 and Rd3. This reduces the amount of non-conduction path current drawn from the voltage source 204 at the node MP. The output of the midpoint bias circuit 202 is also fed back to the replica circuit 206 so that its output Vmp can accurately reflect the changes made to the resistance Rd1.

By virtue of the replica circuit and mid-point bias circuit of the present invention, many advantages over prior low voltage differential signaling devices and schemes are obtained. For example, the present invention provides matched single-ended and differential output impedance, stable common mode voltage, and portability to different fabrication processes.

Figure 3:
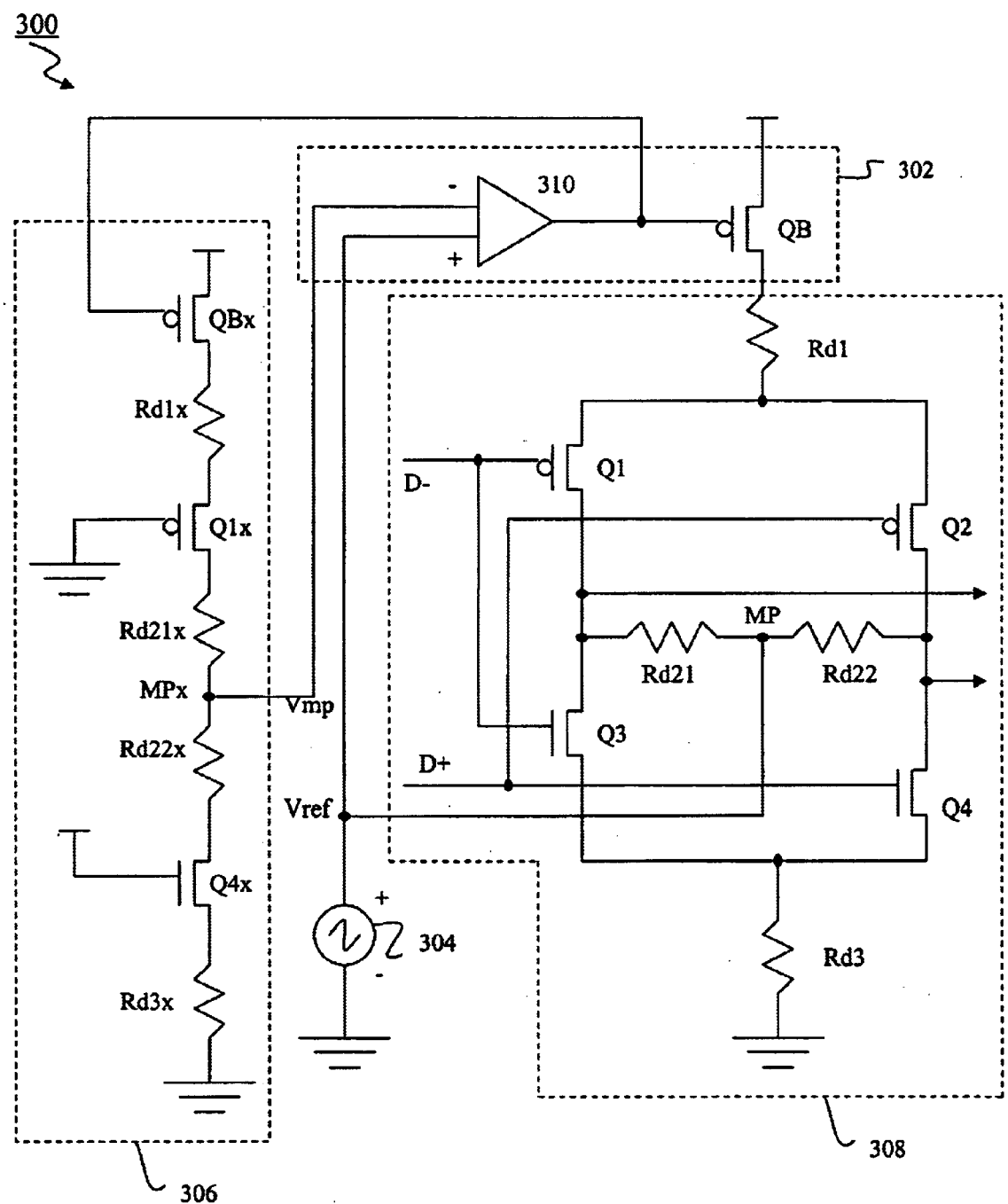
FIG. 3 is a schematic diagram illustrating an example of an LVDS driver circuit in accordance with the principles of the invention as illustrated in FIG. 2.

An example implementation of the invention in accordance with the concepts described in connection with FIG. 2 is illustrated in FIG. 3. As shown in FIG. 3, LVDS driver circuit 300 includes a mid-point bias circuit 302, a voltage source 304 a replica circuit 306, and a signaling circuit 308.

Figure 1:
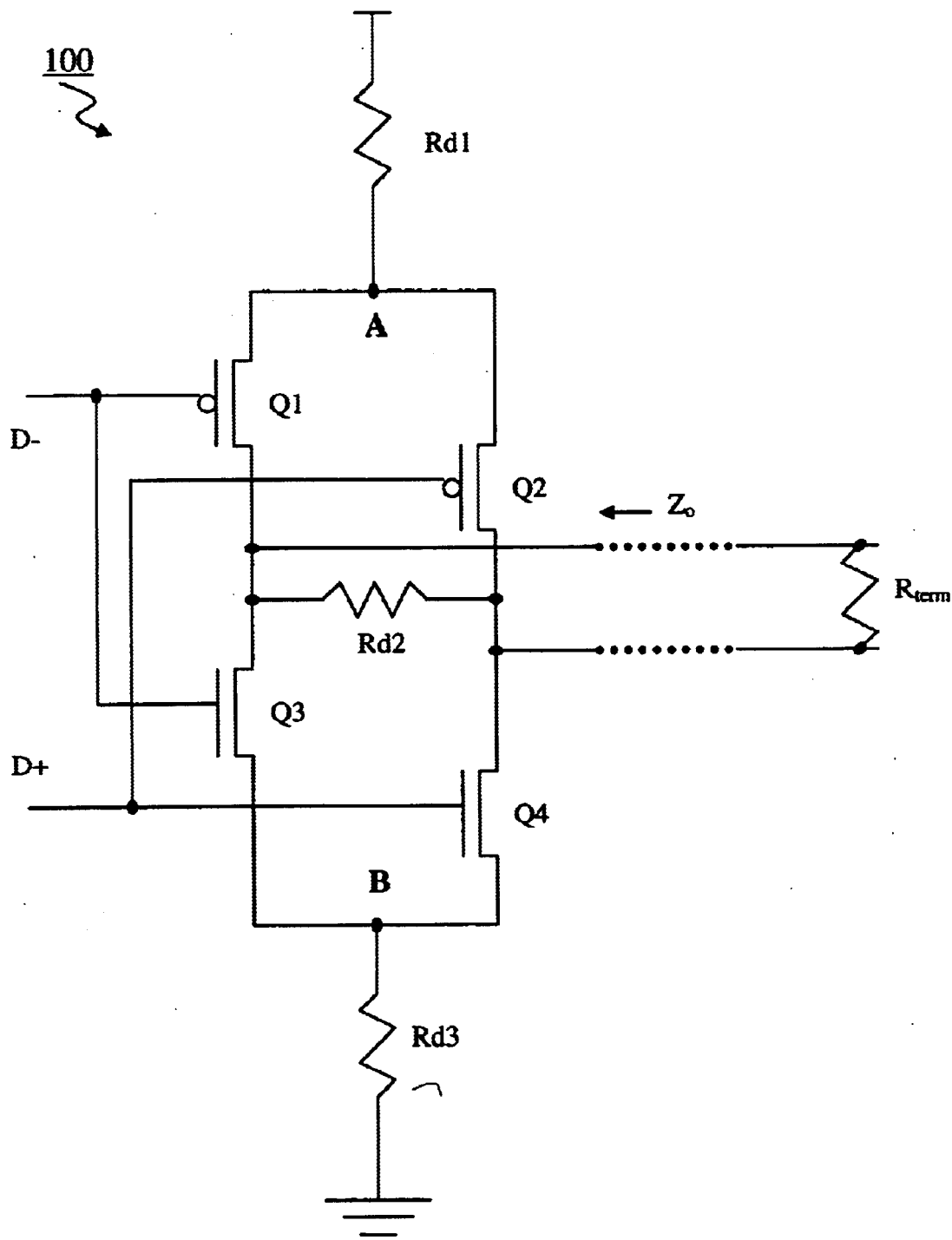
FIG. 1 illustrates an LVDS driver circuit in accordance with U.S. application Ser. No. 09/626,264.

As should be apparent, signaling circuit 308 is substantially the same as the signaling circuit 100 disclosed and described above in connection with FIG. 1. Significantly different, however, is that circuit 308 includes a pair of substantially equal resistors Rd21 and Rd22 in place of resistor Rd2, with the midpoint node between these resistors tied to a voltage source 304 providing a reference voltage Vref.

Voltage source 304 can be implemented by, for example, an external bandgap voltage reference circuit, or a resistor voltage divider in parallel with a large capacitance. In accordance with the current minimization benefits achieved by virtue of an aspect of the invention, however, the voltage source 304 need not be implemented by more sophisticated components such as a regulated power supply.

Replica circuit 306 is intended to duplicate one of the conduction paths in signaling circuit 308 so as to provide an anticipated mid-point bias voltage Vmp to bias circuit 302 for comparison. As shown in FIG. 3, replica circuit 306 includes the following components connected in series between a power supply voltage Vdd and ground voltage Vss: resistor Rd1x corresponding to resistor Rd1 in circuit 308, PFET Q1x corresponding to PFET Q1, resistor Rd21x corresponding to resistor Rd21, resistor Rd22x corresponding to resistor Rd22, NFET Q3x corresponding to NFET Q3, and resistor Rd3x corresponding to resistor Rd3. As further shown in FIG. 3, replica circuit 306 further includes PFET QBx in series connection together with the above components. PFET QBx corresponds to QB in bias circuit 302 that will be described in more detail below, but which also lies in the conduction path of signaling circuit 308 and is needed to provide feedback.

Replica circuit 308 further includes node MPx lying at the midpoint between resistors Rd21x and Rd22x at which the voltage Vmp is provided. The voltage Vmp thus represents the voltage at node MP in the absence of its connection to voltage source 304 during signaling of any logic state by signaling circuit 308.

As is apparent from FIG. 3, PFET Q1x and NFET Q4x are driven into full conduction by fixed connection to ground voltage Vss and supply voltage Vdd, respectively.

For replica circuit 306 to exactly replicate the components of signaling circuit 308, the values of all corresponding components could be designed to be the same between replica circuit 306 and signaling circuit 308. However, according to an aspect of the invention, the component values in replica circuit 306 are scaled (either directly or inversely, as will become apparent below) by a constant factor, so as to minimize power consumption of the overall circuit. In one example of the invention where Vdd is about 3.3V and the desired common mode voltage and Vref is about 1.2V, Rd1 is 50 ohms, PFET Q1 has a W/L of about 727, Rd21 and Rd22 are about 63 ohms, NFET has a W/L of about 400, and Rd3 is 110 ohms. Accordingly, with a scale factor of 8, Rd1x is 400 ohms, PFET Q1x has a W/L of about 91, Rd21x and Rd22x are about 560 ohms, NFET Q4x has a W/L of about 50, and Rd3x is 880 ohms. As will be understood by those skilled in the art, for 2.5V operation the values would be similar.

As further shown in FIG. 3, mid point bias circuit 302 includes a comparator 310 that receives the voltage reference Vref from voltage source 304 and the replicated midpoint bias voltage Vmp from replica circuit 306 and produces a bias output that is provided to biasing transistor PFET QB, and is fed back to corresponding PFET QBx in replica circuit 306. The comparator 310 can be implemented by, for example, a two stage op amp with sufficient gain to reduce the voltage difference between Vref and Vmp to a small value (e.g. approximately 10 mV).

According to an aspect of the invention, comparator 310 and PFET QB are tuned so that when the voltage Vmp equals the desired common mode voltage Vref during the signaling of any logic state, the DC current from node MP in signaling circuit 308 is minimized. In one example of the invention, with signaling circuit 308 and replica circuit 306 having the component values as described above, PFET QB has a W/L of about 644 and corresponding PFET QBx has a W/L of about 81.

In operation of circuit 300, by virtue of the series connection of PFET QB with resistor Rd1, the overall resistance in the conduction path between the voltage supply Vdd and transistors Q1 and Q2 will depend on the biasing voltage supplied by the output of comparator 310. Changes in this resistance, together with the resistances supplied in the remainder of the conduction path, affects the voltage division between the respective resistances, and thus changes the voltage at node MP, and thus the amount of current needed to maintain the voltage at the desired common mode voltage Vref. As noted above, the components are tuned so that the voltage at node MP remains at the desired common mode voltage with minimal current.

Although in this example, PFET QB is coupled in series with resistor Rd1, similar results can be obtained by placing PFET QB is parallel connection with resistor Rd1. However, a series connection provides desirable power-down speeds and performance.

Figure 4:
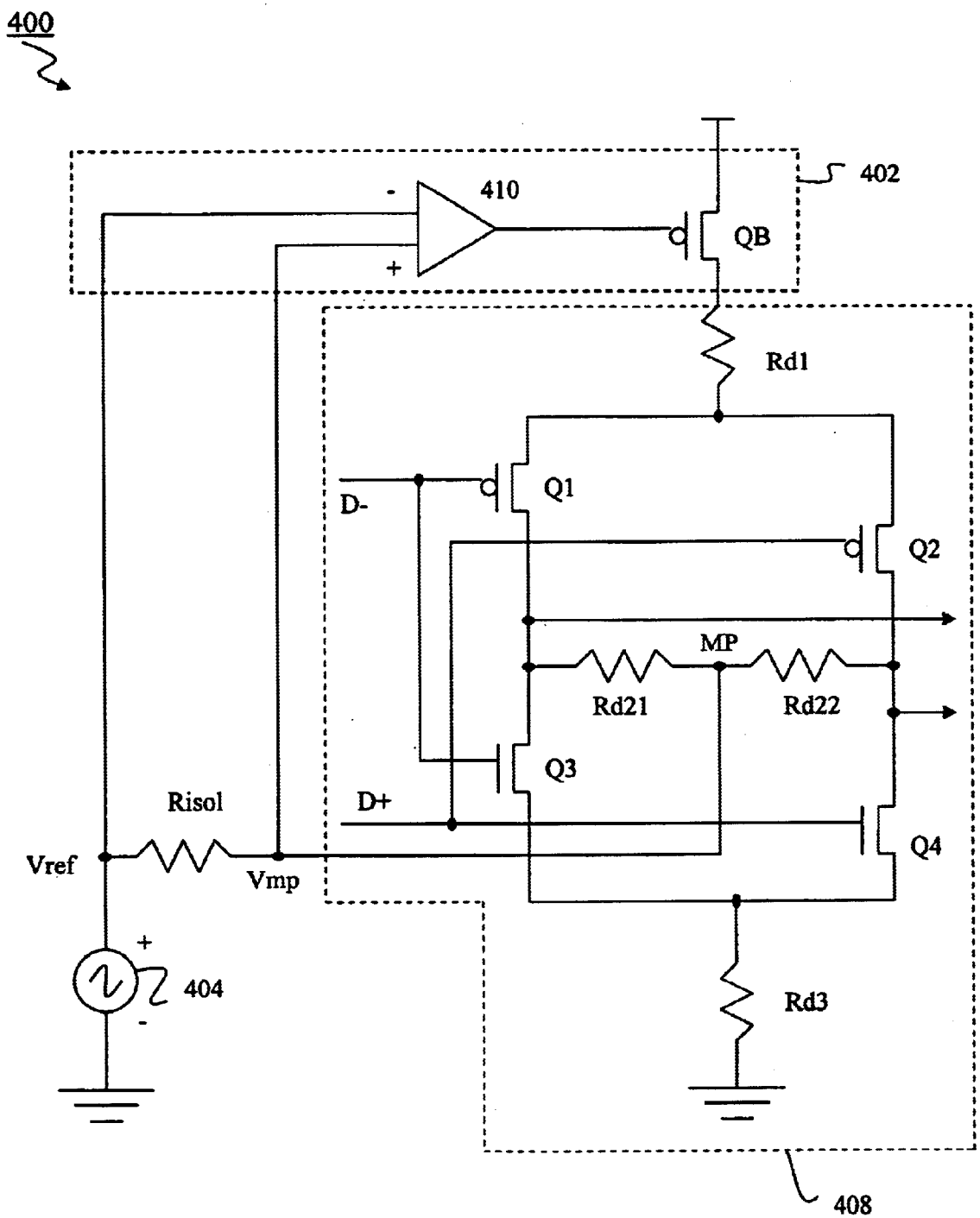
FIG. 4 is a schematic diagram illustrating an example of an LVDS driver circuit in accordance with the principles of the invention as illustrated in FIG. 2.

Another example implementation of the invention is illustrated in FIG. 4. With reference to the conceptual diagram of FIG. 2, this example implementation does not include a replica circuit for providing the mid-point voltage. Rather, as shown in FIG. 4, LVDS driver circuit 400 includes a mid-point bias circuit 402 that directly senses the difference between Vmp and Vref as established across an isolation resistor Risol.

In one example implementation Risol has a value of about 50–150 ohms and mid-point bias circuit 402 operates to minimize the voltage across it, so as to thus minimize the current drawn from node MP.

An advantage of this implementation is that voltage source 404 can be implemented by an on-chip voltage source of about 1.2 V rather than an external source, given that sensitivity to power and ground fluctuations is reduced in this configuration.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims include such changes and modifications.

What is claimed is:

1. A low-voltage differential signaling apparatus, comprising:

a signaling circuit coupled to first and second transmission lines, the signaling circuit being adapted to signal logic states on the transmission lines by establishing a differential voltage from a common mode voltage between the first and second transmission lines, the differential voltage having a polarity corresponding to the logic states, the signaling circuit having a midpoint node, the signaling circuit including:

first and second conduction paths corresponding to first and second logic states, the first and second conduction paths commonly including the midpoint node, wherein the conduction paths include a series connection of resistances, a desired midpoint node voltage being established by a voltage division of the resistances;

a bias circuit coupled to the signaling circuit, the bias circuit providing a bias output to the signaling circuit that maintains the midpoint node at the desired voltage, wherein the series connection includes a first fixed resistance and a variable resistance commonly connected in the conduction paths, the variable resistance being comprised of a second fixed resistance connected in one of a series connection and a parallel connection with a transistor, the bias circuit being operative to maintain the midpoint node at the desired voltage by adjusting the voltage division using the variable resistance.

2. The apparatus according to claim 1, wherein the desired voltage is the common mode voltage.

3. The apparatus according to claim 1, further comprising a replica circuit coupled to the bias circuit, the replica circuit providing an anticipated midpoint node output to the bias circuit, the bias circuit adjusting the variable resistance in accordance with the anticipated midpoint node output.

4. The apparatus according to claim 3, wherein the replica circuit comprises components corresponding to one of the first and second conduction paths.

5. The apparatus according to claim 4, wherein the replica circuit includes scaled resistances corresponding to the resistances in the conduction paths.

6. A low-voltage differential signaling apparatus, comprising:
- a signaling circuit coupled to first and second transmission lines, the signaling circuit being adapted to signal logic states on the transmission lines by establishing a differential voltage from a common mode voltage between the first and second transmission lines, the differential voltage having a polarity corresponding to the logic states, the signaling circuit having a midpoint node;
- a bias circuit coupled to the signaling circuit, the bias circuit providing a bias output to the signaling circuit that maintains the midpoint node at a desired voltage; and
- an isolation resistor coupled to the bias circuit and between the midpoint node and a voltage source providing the desired voltage, the bias circuit being operative to maintain the midpoint node at the desired voltage by sensing a voltage drop across the isolation resistor.

7. A low-voltage differential signaling apparatus, comprising:
- a resistor pair providing a resistance between a first end and a second end, the first end and the second end being coupled to first and second transmission lines, respectively, the resistor pair being connected in series together between the first and second ends at a midpoint node;
- first and second voltage sources coupled to first and second nodes, respectively;
- a variable resistance coupled between the first voltage source and the first node and in series with the resistor pair, the variable resistance being comprised of a fixed resistance connected in one of a series connection and a parallel connection with a transistor;
- a second resistor coupled between the second voltage source and the second node and in series with the resistor pair, a desired midpoint node voltage being established at the midpoint node by a voltage division of the series-connected resistances;
- switches coupled between the first and second nodes and the first and second ends of the resistor pair;
- driver inputs coupled to the switches for selectively coupling the first end of the resistor pair to one of the first and second nodes and the second end of the resistor pair to the other of the first and second nodes in accordance with a logic state desired to be signaled on the first and second transmission lines; and
- a bias circuit coupled between the first node and the first voltage source, the bias circuit being operative to maintain the midpoint node at the desired voltage,
- wherein the bias circuit is operative to maintain the midpoint node at the desired voltage by adjusting the voltage division using the variable resistance.

8. The apparatus according to claim 7, wherein the logic state corresponds to the polarity of a differential voltage established across the resistor pair.

9. The apparatus according to claim 7, wherein the switches are comprised of transistors.

10. The apparatus according to claim 7, further comprising a replica circuit coupled to the bias circuit, the replica circuit producing an output corresponding to an anticipated midpoint node voltage, the bias circuit adjusting the variable resistance in accordance with the replica circuit output.

11. A low-voltage differential signaling apparatus, comprising:
- a resistor pair providing a resistance between a first end and a second end, the first end and the second end being coupled to first and second transmission lines, respectively, the resistor pair being connected in series together between the first and second ends at a midpoint node;
- first and second voltage sources coupled to first and second nodes, respectively;
- switches coupled between the first and second nodes and the first and second ends of the resistor pair;
- driver inputs coupled to the switches for selectively coupling the first end of the resistor pair to one of the first and second nodes and the second end of the resistor pair to the other of the first and second nodes in accordance with a logic state desired to be signaled on the first and second transmission lines; and
- a bias circuit coupled between the first node and the first voltage source, the bias circuit being operative to maintain the midpoint node at a desired voltage; and
- an isolation resistor coupled to the bias circuit and between the midpoint node and a second voltage source providing the desired voltage, the bias circuit being operative to maintain the midpoint node at the desired voltage by sensing a voltage drop across the isolation resistor.

* * * * *